US012610716B2

(12) United States Patent
Wang et al.

(10) Patent No.: US 12,610,716 B2
(45) Date of Patent: Apr. 21, 2026

(54) CURVED DISPLAY WITH ARCHED PAD SUPPORT

(71) Applicant: WUHAN CHINA STAR OPTOELECTRONICS SEMICONDUCTOR DISPLAY TECHNOLOGY CO., LTD., Wuhan (CN)

(72) Inventors: Zuojia Wang, Wuhan (CN); Si Xie, Wuhan (CN); Ping He, Wuhan (CN); Junjie Mei, Wuhan (CN); Jun Yang, Wuhan (CN); Qian Liu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 463 days.

(21) Appl. No.: 18/548,461

(22) PCT Filed: Aug. 3, 2023

(86) PCT No.: PCT/CN2023/110999
§ 371 (c)(1),
(2) Date: Aug. 30, 2023

(87) PCT Pub. No.: WO2025/020221
PCT Pub. Date: Jan. 30, 2025

(65) Prior Publication Data
US 2025/0089520 A1     Mar. 13, 2025

(30) Foreign Application Priority Data
Jul. 24, 2023     (CN) ........................ 202310914438.X

(51) Int. Cl.
H10K 59/82          (2023.01)
H10K 102/00         (2023.01)

(52) U.S. Cl.
CPC ....... *H10K 59/82* (2023.02); *H10K 2102/311* (2023.02)

(58) Field of Classification Search
CPC ............. H10K 59/82; H10K 2102/311; H10K 77/111; H10K 59/88; H10K 59/12; H10K 59/131; H10K 59/87
See application file for complete search history.

(56) References Cited

U.S. PATENT DOCUMENTS 10,153,337 B2 *   12/2018   Lee ......................... H01L 25/18
11,877,483 B2 *   1/2024   Lee .................... H10K 59/8723
(Continued)

FOREIGN PATENT DOCUMENTS

CN      112927628 A      6/2021
CN      113516914 A      10/2021
(Continued)

OTHER PUBLICATIONS

Korean Office Action issued in corresponding Korean Patent Application No. 10-2023-7039481 , dated Dec. 18, 2024, with English translation, total 16 pages provided.
(Continued)

*Primary Examiner* — J. E. Schoenholtz
(74) *Attorney, Agent, or Firm* — HSML P.C.

(57)          ABSTRACT

A display panel is disclosed in the present application. A display portion is bent about at least a first direction to define a first arc shape, and the first arc shape has a first radius of curvature. A driving chip is bonded to a pad portion. A support pad is provided between the display portion and the pad portion, and is provided corresponding to at least the driving chip. The support pad includes a first surface toward (Continued)

the display portion and a second surface toward the pad portion, the first surface is in contact with the first arc shape, and the second surface is a flat surface.

18 Claims, 8 Drawing Sheets

(56) References Cited

U.S. PATENT DOCUMENTS

| | | | |
|---|---|---|---|
| 12,103,284 B2 * | 10/2024 | Lee | B32B 3/085 |
| 2022/0028946 A1 * | 1/2022 | Kim | H10K 59/124 |
| 2022/0035411 A1 | 2/2022 | Abe et al. | |
| 2023/0206797 A1 * | 6/2023 | Shin | H05K 5/03 |
| | | | 361/679.01 |
| 2024/0014198 A1 * | 1/2024 | Shin | H10K 50/844 |

FOREIGN PATENT DOCUMENTS

| | | |
|---|---|---|
| CN | 114220840 A | 3/2022 |
| CN | 115064066 A | 9/2022 |
| CN | 115273664 A | 11/2022 |
| CN | 116381978 A | 7/2023 |
| KR | 10-2014-0122597 A | 10/2014 |
| KR | 10-2018-0030326 A | 3/2018 |
| KR | 10-2023-0097507 A | 7/2023 |

OTHER PUBLICATIONS

International Search Report in International application No. PCT/CN2023/110999, mailed on Oct. 12, 2023; with English translation.
Written Opinion of the International Search Authority in International application No. PCT/CN2023/110999, mailed on Oct. 12, 2023, with English translation.

* cited by examiner

1203(12031)

1203(12032)

111

130(1301)

130(1302)

112

1

CURVED DISPLAY WITH ARCHED PAD SUPPORT

TECHNICAL FIELD

The present application relates to the field of display technologies, and more particularly, to a display panel.

BACKGROUND

A Flexible display device such as flexible organic light-emitting display (OLED) has been widely used in life, and a display panel with a narrow frame in which a pad is bent to a back side of a display portion by a bending portion has been developed. Meanwhile, a display panel in which a display portion is bent into a large curved surface or a full curved surface has been developed, and a pad of the display panel is bent in response to a bending of the display portion.

However, due to the pad bending in response to the bending of the display portion, a driving chip bonded to the pad is deformed or subjected to a large deformation stress, so that the driving chip is easily damaged.

SUMMARY

An embodiment of the present application provides a display panel, which can solve a problem that a driving chip bonded to the pad is deformed or subjected to a large deformation stress and resulted in easily damage, due to the pad bending in response to the bending of the display portion.

An embodiment of the present application provides a display panel including:

a display panel body including a display portion, a bending portion, and a pad portion, wherein the pad portion is provided on a backlight side of the display portion, the bending portion is extensible, the display portion is bent about at least a first direction to define a first arc shape, and the first arc shape has a first radius of curvature;

a driving chip bonded to the pad portion;

a support pad provided between the display portion and the pad portion, wherein the support pad is provided corresponding to at least the driving chip, the support pad includes a first surface toward the display portion and a second surface toward the pad portion, the first surface is in contact with the first arc shape, and the second surface is a flat surface.

In an embodiment, the pad portion is connected to an arc-shaped side edge of the display portion, and the display panel further includes:

a back plate including a first back plate and a second back plate, wherein the first back plate is attached to the backlight side of the display portion, and the second back plate is attached to a side of the pad portion close to the display portion;

wherein the first back plate includes a first edge close to the bending portion, and the second back plate includes a second edge close to the bending portion;

wherein the first edge is linear, the second edge includes a first sub-segment edge corresponding to an intermediate portion of the arc-shaped side edge of the first arc shape, and a distance from the second edge to the first edge has a decreasing tendency from a center of the first sub-segment edge to both ends of the first sub-segment edge.

In an embodiment, the display position is bent on both sides of the first arc shape to provide a second arc shape and a third arc shape respectively, the second arc shape and the third arc shape have a second radius of curvature, and the first radius of curvature is greater than the second radius of curvature.

In an embodiment, the second edge includes a second sub-segment edge on a side of the first sub-segment edge, and a third sub-segment edge on another side of the first sub-segment edge; and the second sub-segment edge corresponds to at least the second arc shape, and the third sub-segment edge corresponds to at least the third arc shape.

In an embodiment, the display panel further including:

a protective glue line including a first sub-protective glue line and a second sub-protective glue line, wherein the first sub-protective glue line is arranged corresponding to the first edge, the second sub-protective glue line is arranged corresponding to the second edge, the first sub-protective glue line is extended in a same direction with the first edge, and the second sub-protective glue line is extended in a same direction with the second edge.

In an embodiment, the first sub-protective glue line is provided on the first edge, and the second sub-protective glue line is provided on the second edge; or the first sub-protective glue is disposed on a side of the display panel body away from the first edge, and the second sub-protective glue line is disposed on a side of the display panel body away from the second edge.

In an embodiment, a first end is defined on an end of the first back plate close to the bending portion, a second end is defined on an end of the second back plate close to the bending portion, and a distance from at least a part of the first end to an edge of the display panel corresponding to the bending portion is less than a distance from the second end to an edge of the display panel corresponding to the bending portion.

In an embodiment, the pad portion includes a plurality of pad terminals, the plurality of pad terminals is arranged in a line parallel to the first edge, and each of points on the first edge has a same distance to the line; and the second edge includes a first point on the second edge, a distance D is defined from the line to the first point, the bending portion between the first point and the first edge has a tensile ratio a, and the distance D is inversely correlated with the tensile ratio a.

In an embodiment, a width of the pad portion in a second direction is less than a width of the display portion in the second direction;

a width of the support pad in the second direction is greater than or equal to the width of the pad portion in the second direction, and the first direction is perpendicular to the second direction; and a curvature of the first surface is same as a curvature of the first arc shape.

In an embodiment, the support pad includes a first sub-support pad and a second sub-support pad, the first sub-support pad and the second sub-support pad are stacked, a width of the first sub-support pad in the second direction is greater than a width of the second sub-support pad in the second direction, and an elastic modulus of the first sub-support pad is less than an elastic modulus of the second sub-support pad; wherein the first sub-support pad includes a groove close to a side surface of the pad portion, the second sub-support pad is received in the groove, and an orthographic projection of the second sub-support pad on the pad portion covers an orthographic projection of the driving chip on the pad portion; and a surface of the first sub-support pad close to the pad portion and a surface of the second sub-support pad close to the pad portion are on a same plane.

In an embodiment, material of the first sub-support pad includes acrylic resin, and material of the second sub-support pad includes stainless steel.

In an embodiment, the support pad includes a third sub-support pad and a fourth sub-support pad, the third sub-support pad includes a first sub-segment and a second sub-segment spaced apart, the fourth sub-support pad is arranged between the first sub-segment and the second sub-segment in the second direction, an elastic modulus of the third sub-support pad is less than an elastic modulus of the fourth sub-support pad, and an orthographic projection of the fourth sub-support pad on the pad portion covers an orthographic projection of the driving chip on the pad portion; and a portion of the first surface corresponding to the first sub-segment has a same curvature with a portion of the first arc shape attached with the first sub-segment, and a portion of the first surface corresponding to the second sub-segment has a same curvature with a portion of the first arc shape attached with the second sub-segment.

In an embodiment, the first sub-segment is disposed between the display portion and the pad portion, and the second sub-segment is disposed between the display portion and the pad portion; wherein a side of the fourth sub-support pad is attached to the pad portion, and another side surface of the fourth sub-support pad is spaced from the display portion.

In an embodiment, the driving chip is arranged on a side of the pad portion away from the display portion.

Beneficial Effect

According to an embodiment of the present application, a display panel is provided. The display panel includes a display panel body, a driving chip, and a support pad. The display panel body has a display portion, a bending portion, and a pad portion, wherein the pad portion is provided on a backlight side of the display portion, the bending portion is extensible, and the display portion is bent at least around a first direction to define a first arc shape. The first arc shape has a first radius of curvature; The driving chip is bonded to the pad portion. The support pad is provided between the display portion and the pad portion, the support pad is provided corresponding to at least the driving chip, the support pad includes a first surface toward the display portion and a second surface toward the pad portion, the first surface is in contact with the first arc shape, and the second surface is a flat surface. In the present application, the support pad is provided corresponding to at least the driving chip, the support pad includes a first surface toward the display portion and a second surface toward the pad portion, the first surface is in contact with the first arc shape, and the second surface is a flat surface, as such, the support pad at least makes the portion of the pad portion where the driving chip is provided flat. The driving chip is preventing from bending along with the bending of the display portion or the pad portion, and the support pad provides a flat support to prevent the driving chip bound on the pad portion from being deformed or subjected to a large deformation stress. Thus, the driving chip is not easily damaged.

BRIEF DESCRIPTION OF THE DRAWINGS

In order that the technical solution in the embodiments of the present application may be explained more clearly, reference will now be made briefly to the accompanying drawings required for describing the embodiments. It should be understood that the accompanying drawings in the following description are merely some references to the embodiments of the present application, and other drawings may be made to those skilled in the art without involving any inventive effort.

DETAILED DESCRIPTION OF THE EMBODIMENTS

In the following, the technical solutions in the embodiments of the present application will be clearly and completely described in connection with the accompanying drawing. It should be understood that the described embodiments are merely a part of the implemented ways of the present application, rather than all. Based on the embodiments provided in the present application, all other implemented ways obtained by a person skilled in the art without involving any inventive effort are within the scope of the present application. Furthermore, it should be understood that the embodiments described herein are for purposes of illustration and explanation only and are not intended to limit the present application. In the present application, if not stated to the contrary, the use of positional terms such as "on" and "under" refer to a position on and under the device in use or operation. The terms such as "inside" and "outside" refer to the outlines of the device.

An embodiment of the present invention provides a display panel. The display panel includes a display panel body, a driving chip, and a support pad. The display panel body includes a display portion, a bending portion, and a pad portion, wherein the pad portion is provided on a backlight side of the display portion, the bending portion is extensible, and the display portion is bent about at least a first direction to define a first arc shape having a first radius of curvature. The driving chip is bonded to the pad portion. The support pad is provided between the display portion and the pad portion, and is provided corresponding to at least the driving chip. The support pad includes a first surface toward the display portion, and a second surface toward the pad portion. The first surface is in contact with the first arc shape, and the second surface is a flat. Detailed descriptions are given below. It should be noted that the order in which the following embodiments are described is not intended to limit the preferred order of the embodiments.

Embodiment 1

Figure 1:
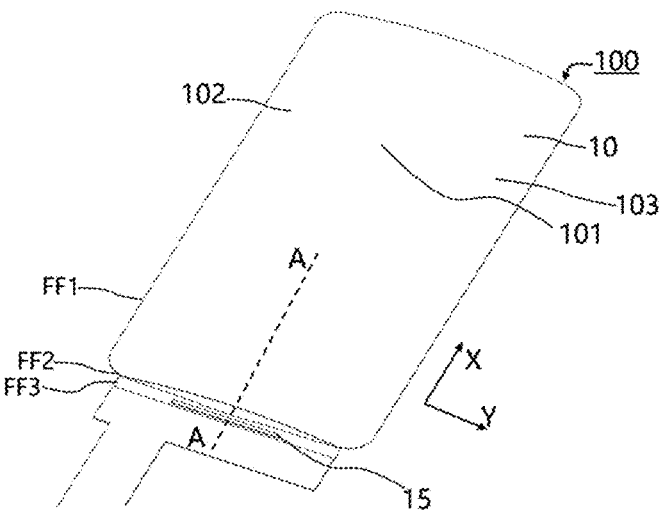
FIG. 1 is a top perspective view of a front side of a display panel according to a first embodiment of the present application.
Figure 2:
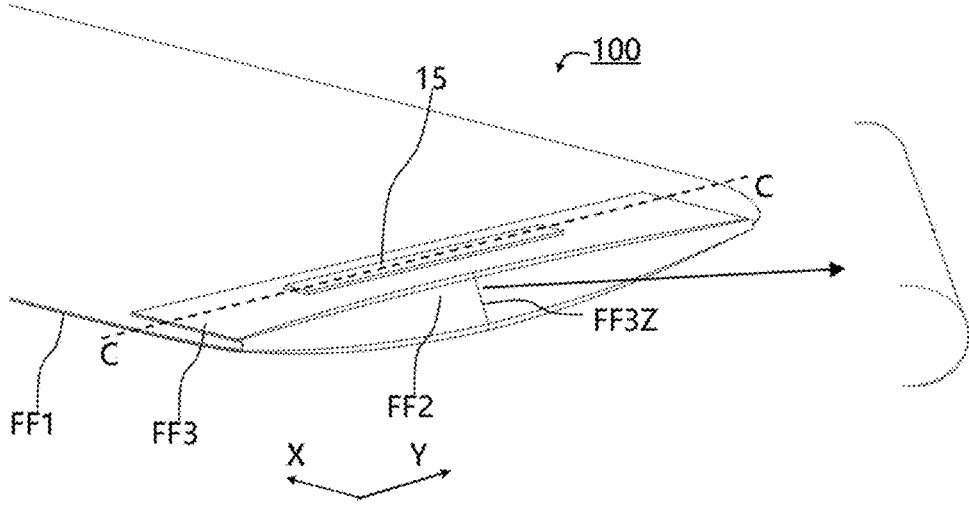
FIG. 2 is a side perspective view of a display panel according to a first embodiment of the present application.
Figure 3:
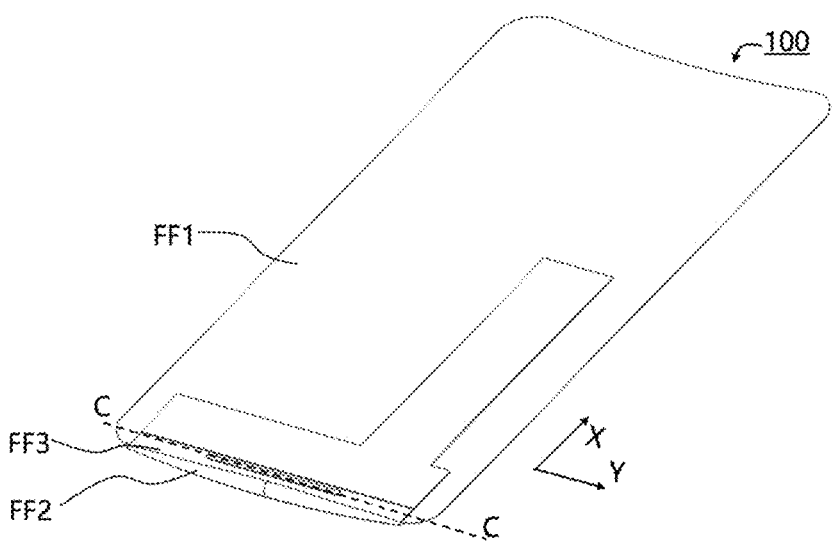
FIG. 3 is a top perspective view of a rear side of a display panel according to a first embodiment of the present application.
Figure 4:
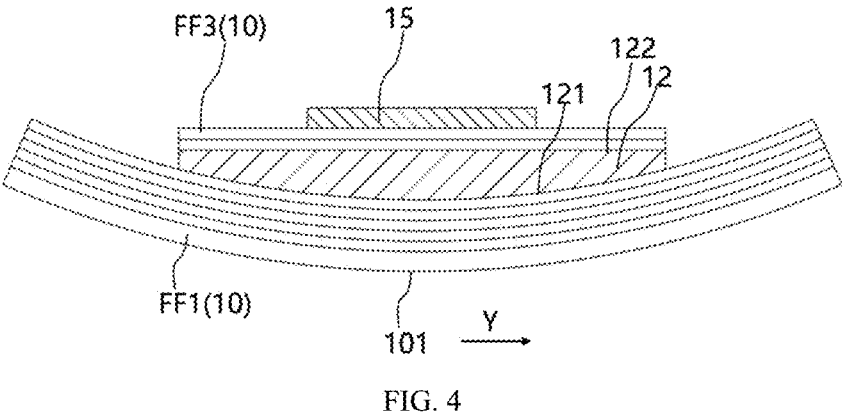
FIG. 4 is a schematic cross-sectional view of a display panel according to a first embodiment of the present application, wherein the display panel is bent.
Figure 5:
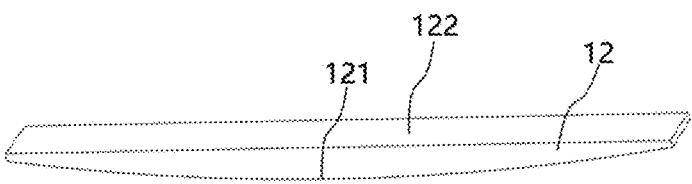
FIG. 5 is a perspective view of a first support pad according to a first embodiment of the present application.

Referring to FIG. 1 to FIG. 5, FIG. 1 is a top perspective view of a front side of a display panel according to a first embodiment of the present application; FIG. 2 is a side perspective view of a display panel according to a first embodiment of the present application; FIG. 3 is a top perspective view of a rear side of a display panel according to a first embodiment of the present application; FIG. 4 is a schematic cross-sectional view of a display panel according to a first embodiment of the present application, wherein the display panel is bent; and FIG. 5 is a perspective view of a first support pad according to a first embodiment of the present application.

It should be noted that FIG. 1 illustrates a state that the bending portion FF2 is not bent, FIG. 2 to FIG. 3 illustrate a state that the bending portion FF2 is bent; and FIG. 4 is a schematic cross-sectional view taken along the dashed line C-C in FIG. 2 or FIG. 3.

Note that the present application will be described with the state that the bending portion FF2 is bent, as shown in FIG. 2 and FIG. 3.

FIG. 1 to FIG. 3 show a first direction X and a second direction Y, the first direction X is perpendicular to the second direction Y, and the dashed line C-C is extended along the second direction Y as shown in FIG. 2 or in FIG. 3.

A display panel 100 provided in the present application includes a display panel body 10, a driving chip 15, and a support pad 12. The display panel body 10 includes a display portion FF1, a bending portion FF2, and a pad portion FF3, wherein the pad portion FF3 is provided on a backlight side of the display portion FF1, the bending portion FF2 is extensible, and the display portion FF1 is bent about at least a first direction X to define a first arc shape 101 having a first radius of curvature. The driving chip 15 is bonded to the pad portion FF3. The support pad 12 includes a first surface 121 toward the display portion FF1, and a second surface 122 toward the pad portion FF3. The first surface 121 is in contact with the first arc shape 101, and the second surface 122 is flat.

Specifically, in the first direction X, the display panel body 10 includes the display portion FF1, the pad portion FF3, and the bending portion FF2 between the display portion FF1 and the pad portion FF3. The bending portion FF2 can be bent to the back side of the display portion FF1 to reduce size of the frame, and the bending axis of the bending portion FF2 is parallel to the second direction Y.

Specifically, the direction along which the display portion FF1, the bending portion FF2, and the pad portion FF3 are connected in sequence is the first direction X. In another word, the display portion FF1, the bending portion FF2, and the pad portion FF3 are connected in sequence in the first direction X.

Specifically, the display portion FF1 is bent into at least the first arc shape 101 having the first radius of curvature. In a case that the display portion FF1 is bent or bent into the first arc shape 101 having the first radius of curvature, the bending axis of the first arc shape 101 is parallel to the first direction X.

Specifically, it is shown in FIG. 1 that the middle portion of the display panel 100 is bent into the first arc shape 101.

Specifically, the bending portion FF2 is extendable, and the base of the display panel body 10 is extendable. The bending portion FF2 can be stretched or extruded. The wrings of the bending portion FF2 can be provided in the shape of a serpentine shape, an S-shape, a zigzag shape, or the like, so that the wirings do not break when the bending portion FF2 is bent.

Specifically, the bending portion FF2 in any one of the prior art may have extensibility.

In the present embodiment, the support pad 12 includes a first surface 121 toward the display portion FF1, and a second surface 122 toward the pad portion FF3. The first surface 121 is attached with the first arc shape 101, and the second surface 122 is flat. The support pad 12 has at least a flat portion for the driving chip 15 to dispose on the pad portion FF3, so that the driving chip 15 is prevented from bending along with the bending of the display portion FF1 or the pad portion FF3. The support pad 12 provides a flat portion for the driving chip 15 to dispose thereon, thereby preventing the driving chip 15 bonded to the pad portion FF3 from being deformed or subjected to a large deformation stress. As such, the driving chip 15 is not easily damaged.

In some embodiments, as shown in FIGS. 4 and 5, in the second direction Y, the width of the pad portion FF3 is less than the width of the display portion FF1. In the second direction Y, the width of the support pad 12 is greater than or equal to the width of the pad portion FF3. The first direction X is perpendicular to the second direction Y.

In some embodiments, in the second direction Y, the width of the pad portion FF3 is less than the width of the display portion FF1; In the second direction Y, the width of the support pad 12 is greater than or equal to the width of the pad portion FF3, and the first direction X is perpendicular to the second direction Y. The first surface 121 has the same curvature as the first arc shape 101.

Specifically, in the second direction Y, the width of the pad portion FF3 is less than the width of the display portion FF1, so that the bending portion FF2 can be bent with a reduced width, and the stress concentration can be reduced.

Specifically, in the second direction Y, the width of the support pad 12 is greater than or equal to the width of the pad portion FF3, the first direction X is perpendicular to the second direction Y, and the support pad 12 can provide a complete support function for the pad portion FF3.

Specifically, the curvature of the first surface 121 is the same as the curvature of the first arc shape 101, so that the first surface 121 is perfectly matched with the first arc shape 101 or the display portion FF1.

Embodiment 2

This embodiment is the same as or similar to the display panel according to any one of the first embodiments, and the same parts are not described herein again, and differences are described herein.

Figure 6:
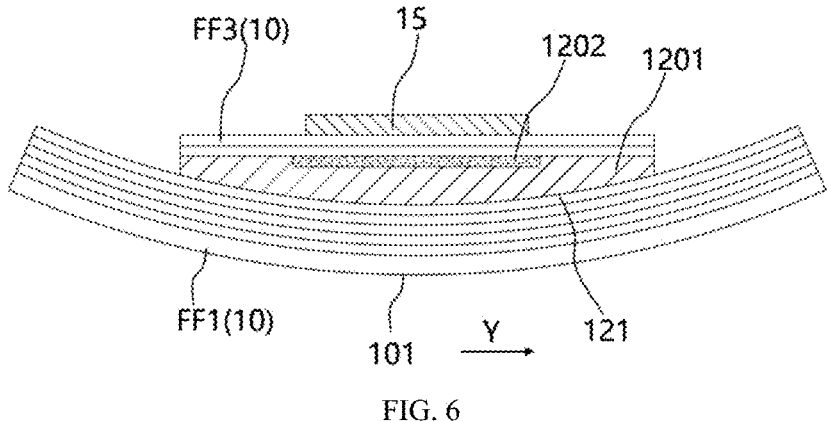
FIG. 6 is a schematic cross-sectional view of a display panel according to a second embodiment of the present application, wherein the display panel is bent.
Figure 7:
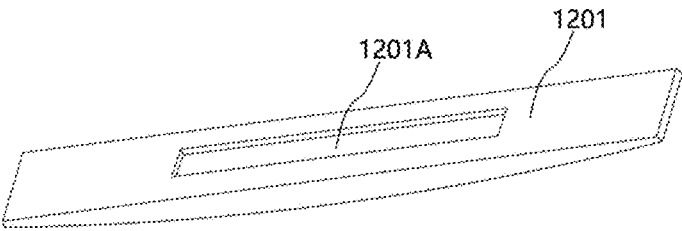
FIG. 7 is a perspective view of a second support pad according to a first embodiment of the present application.

Referring to FIGS. 6 and 7, FIG. 6 is a schematic cross-sectional view of a display panel according to a second embodiment of the present application, wherein the display panel is bent; and FIG. 7 is a perspective view of a second support pad according to a first embodiment of the present application.

It should be noted that FIG. 2 and FIG. 3 show states in which the bending portion FF2 is bent. FIG. 6 is a schematic cross-sectional view taken along the dashed line C-C of FIG. 2 or FIG. 3.

In some embodiments, as shown in FIGS. 6 and 7, the support pad 12 includes a first sub-support pad 1201 and a second sub-support pad 1202, and the first sub-support pad 1201 and the second sub-support pad 1202 are stacked. The width of the first sub-support pad 1201 in the second direction Y is greater than the width of the second sub-support pad 1202 in the second direction Y, and the elastic modulus of the first sub-support pad 1201 is less than the elastic modulus of the second sub-support pad 1202. The first sub-support pad 1201 includes a groove 1201A close to a side surface of the pad portion FF3, and the second sub-support pad 1202 is received in the groove 1201A. An orthographic projection of the second sub-support pad 1202 on the pad portion FF3 covers an orthographic projection of the driving chip 15 on the pad portion FF3.

Specifically, since the elastic modulus of the first sub-support pad 1201 is less than the elastic modulus of the second sub-support pad 1202, and the orthographic projection of the second sub-support pad 1202 on the pad portion FF3 covers the orthographic projection of the driving chip 15 on the pad portion FF3, the second sub-support pad 1202 functions as a flat support for the driving chip 15, and the first sub-support pad 1201 can support other parts of the pad portion FF3.

Specifically, the elastic modulus of the first sub-support pad 1201 is low, so that the surface of the first sub-support pad 1201 can be made to be the first surface 121, and the first surface 121 is attached with the first arc surface 101.

In some embodiments, the surface of the first sub-support pad 1201 close to the pad portion FF3 and the surface of the second sub-support pad 1202 close to the pad portion FF3 are in the same plane.

Specifically, the surface of the first sub-support pad 1201 close to the pad portion FF3 and the surface of the second sub-support pad 1202 close to the pad portion FF3 are in the same plane, so that the first sub-support pad 1201 and the second sub-support pad 1202 are provided with a whole flat surface, thereby providing uniform support for each part of the pad portion FF2, thereby improving the reliability of the display panel 100.

In some embodiments, the material of the first sub-support pad 1201 includes acrylic resin, and the material of the second sub-support pad 1202 includes stainless steel.

Specifically, the material of the first sub-support pad 1201 includes an acrylic resin that easily forms a shape between the first surface 121 and the second surface 122 and matches a space between the display portion FF2 and the pad portion FF3. The material of the second sub-support pad 1202 includes stainless steel, which has a large elastic modulus and can be reliably supported and carried to the driving chip 15 to improve the reliability of the display panel.

Embodiment 3

This embodiment is the same as or similar to the display panel according to any one of the first embodiments, and the same parts are not described herein again, and differences are described herein.

Figure 8:
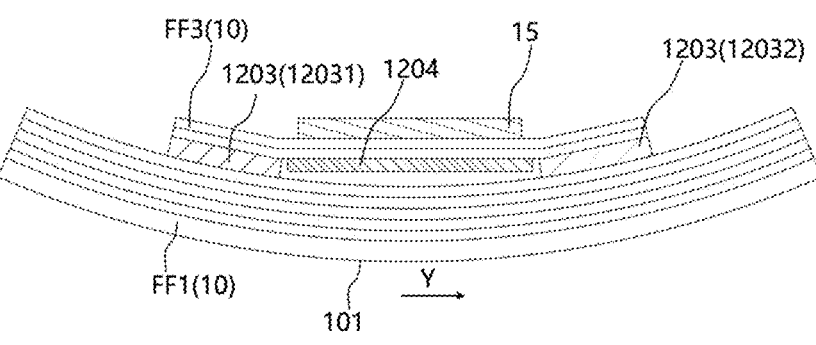
FIG. 8 is a schematic cross-sectional view of a display panel according to a third embodiment of the present application, wherein the display panel is bent.
Figure 9:
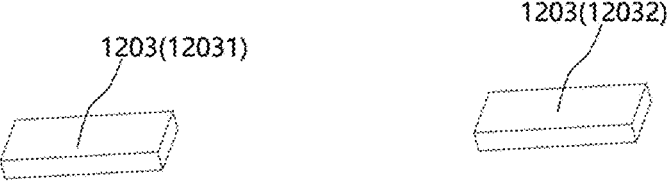
FIG. 9 is a perspective view of a third support pad according to a third embodiment of the present application.

Referring to FIGS. 8 and 9, FIG. 8 a schematic cross-sectional view of a display panel according to a third embodiment of the present application, wherein the display panel is bent; and FIG. 9 is a perspective view of a third support pad according to a third embodiment of the present application.

It should be noted that FIG. 2 and FIG. 3 show states in which the bending portion FF2 is bent. FIG. 8 is a schematic cross-sectional view taken along the dashed line C-C of FIG. 2 or FIG. 3.

In some embodiments, the support pad 12 includes a third sub-support pad 1203 and a fourth sub-support pad 1204. The third sub-support pad 1203 includes a first sub-segment 12031 and a second sub-segment 12032 spaced apart from each other. The fourth sub-support pad 1204 is disposed along the second direction Y between the first sub-segment 12031 and the second sub-segment 12032, the elastic modulus of the third sub-support pad 1203 is less than the elastic modulus of the fourth sub-support pad 1204, and the orthographic projection of the fourth sub-support pad 1204 on the pad portion FF3 covers the orthographic projection of the driving chip 15 on the pad portion FF3. A portion of the first surface corresponding to the first sub-segment has the same curvature as a portion of the first arc shape attached with the first sub-segment, and a portion of the first surface corresponding to the second sub-segment to has the same curvature as a portion of the first arc shape attached with the second sub-segment.

Specifically, the orthographic projection of the fourth sub-support pad 1204 on the pad portion FF3 covers the orthographic projection of the driving chip 15 on the pad portion FF3. At this time, the fourth sub-support pad 1204 provides flat support and bearing for the driving chip 15 to improve the reliability of the display panel 100. At the same time, the first sub-segment 12031 and the second sub-segment 12032 are spaced apart from each other, and the fourth sub-support pad 1204 is arranged between the first sub-segment 12031 and the second sub-segment 12032 in the second direction Y, so that the first sub-segment 12031 and the second sub-segment 12032 are firmly attached and supported, thereby improving the production yield.

Specifically, a portion of the first sub-segment 12031 corresponding to the first surface 121 has the same curvature as a portion of the first sub-segment 12031 attached corresponding to the first arc shape 101, so that the portion of the first sub-segment 12031 corresponding to the first surface 121 is completely attached the portion of the first sub-segment 12031 corresponding to the first arc surface 101, thereby helping to maintain the shape of the first arc shape 101 in the attached position.

Specifically, a portion of the second sub-segment 12032 corresponding to the first surface 121 has the same curvature as a portion of the second sub-segment 12032 attached corresponding to the first arc shape 101, so that the portion of the second sub-segment 12032 corresponding to the first surface 121 is completely attached the portion of the second sub-segment 12032 corresponding to the first arc surface 101, thereby helping to maintain the shape of the first arc shape 101 in the attached position. In some embodiments, the first sub-segment 12031 is disposed between the display portion FF1 and the pad portion FF2, and the second sub-segment 12032 is disposed between the display portion FF1 and the pad portion FF2. A side of the fourth sub-support pad 1204 is attached to the pad portion FF3, and another side of the fourth sub-support pad 1204 is spaced from the display portion FF1.

Specifically, the fourth sub-support pad 1204 provides a flat support and bearing for the driving chip 15, the elastic modulus of the fourth sub-support pad 1204 is relatively large. The other side of the fourth sub-support pad 1204 is spaced from the display portion FF1, that is, a surface of the fourth sub-support pad 1204 close to the display portion FF1 is suspended. As such, a shape of the fourth sub-support pad 1204 is not required to match with the first arc shape 101, so that the selection range of materials can be improved.

In the display panel according to any one of the above, the driving chip 15 is provided at a side of the pad portion FF3 away from the display portion FF1, and the pad terminal to which the driving chip is bonded on the pad portion FF3 can be manufactured in the same process with the wiring or electrode in the display portion FF1, thereby simplifying the manufacturing process.

Embodiment 4

The present embodiment is the same as or similar to the display panel of any one of the above-described embodiments. The present embodiment further describes the structure of the display panel on the basis of the display panel of any one of the above-described embodiments.

Figure 10:
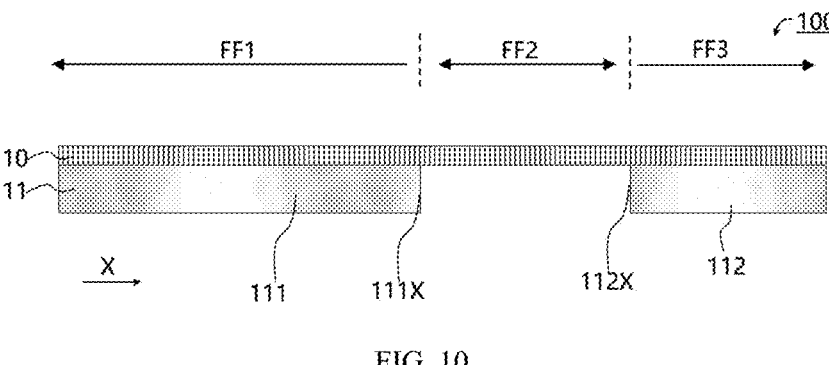
FIG. 10 is a schematic cross-sectional view of a bending portion of a display panel according to a fourth embodiment of the present application, wherein the bending portion is not bent.
Figure 11:
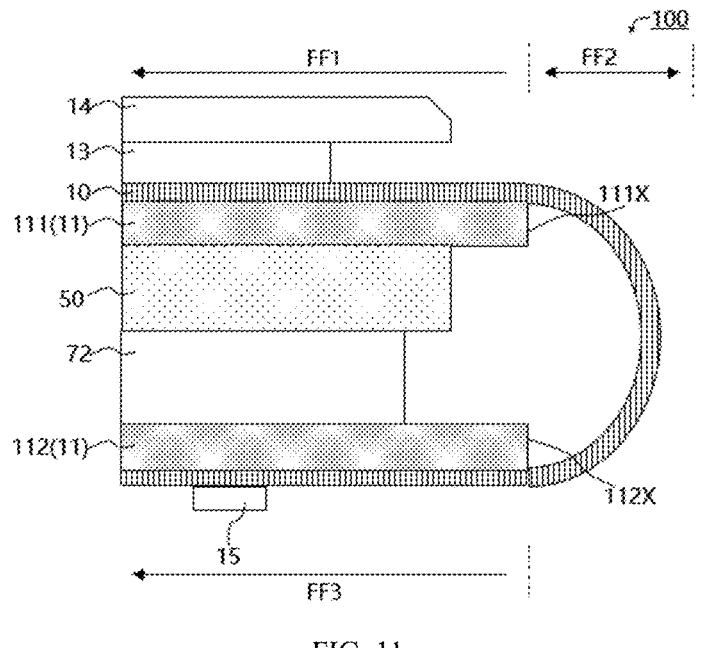
FIG. 11 is a schematic cross-sectional view of a display panel according to a fourth embodiment of the present application, wherein the display panel is bent.
Figure 12:
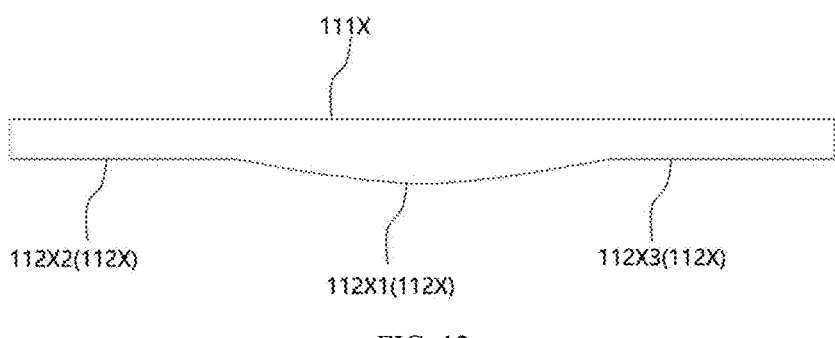
FIG. 12 is a schematic view of an edge of a bending portion of a display panel according to a fourth embodiment of the present application.
Figure 13:
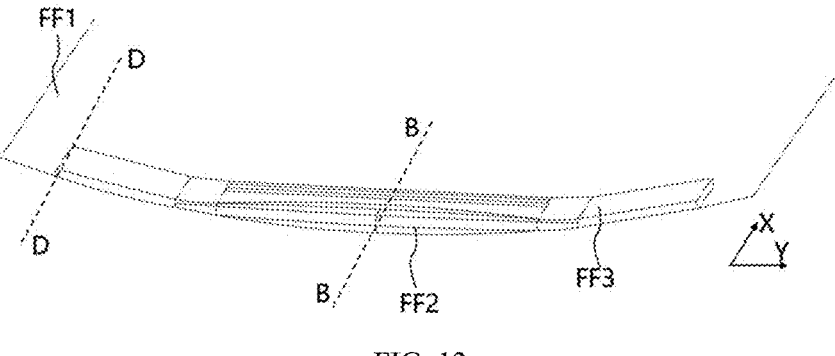
FIG. 13 is a perspective view of an edge of a bending portion of a display panel according to a fourth embodiment of the present application, wherein the edge of the bending portion is bent.
Figure 14:
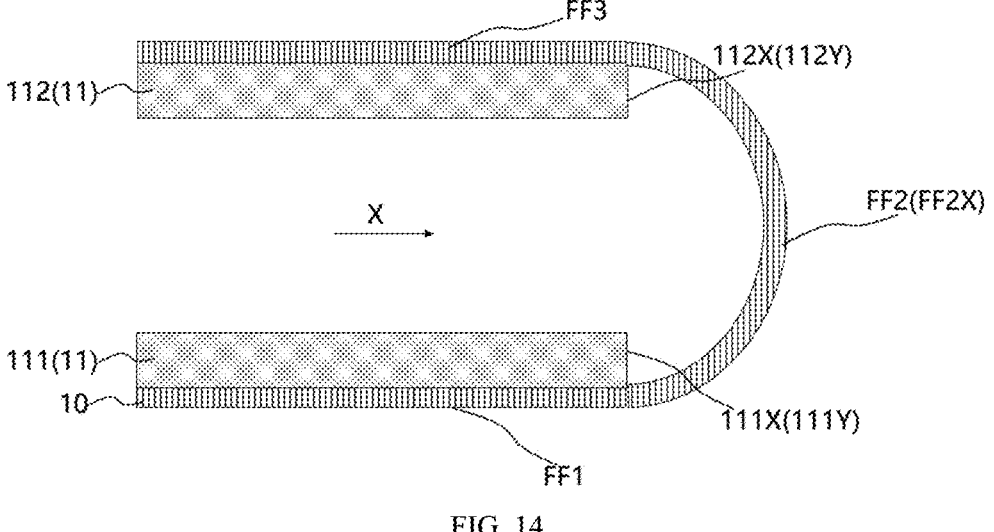
FIG. 14 is a schematic cross-sectional view taken along a dashed line D-D of FIG. 13 to show a film layer structure according to a fourth embodiment of the present application.
Figure 15:
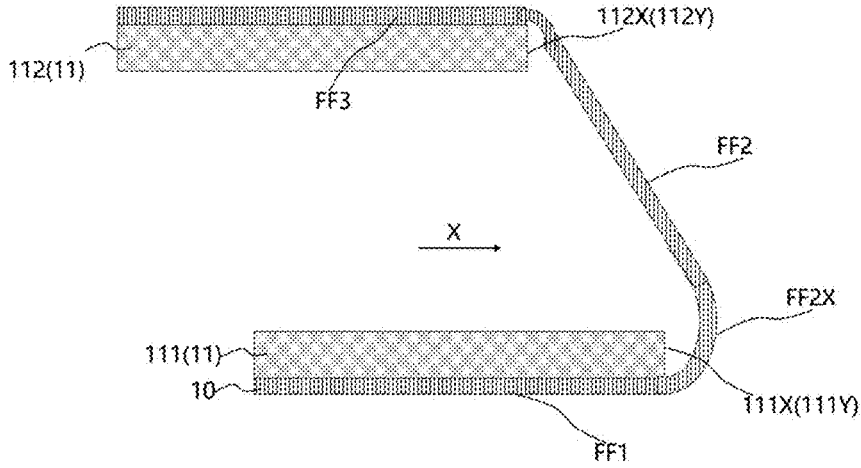
FIG. 15 is a schematic cross-sectional view taken along a dashed line B-B of FIG. 13 to show a film layer structure according to a fourth embodiment of the present application.
Figure 16:
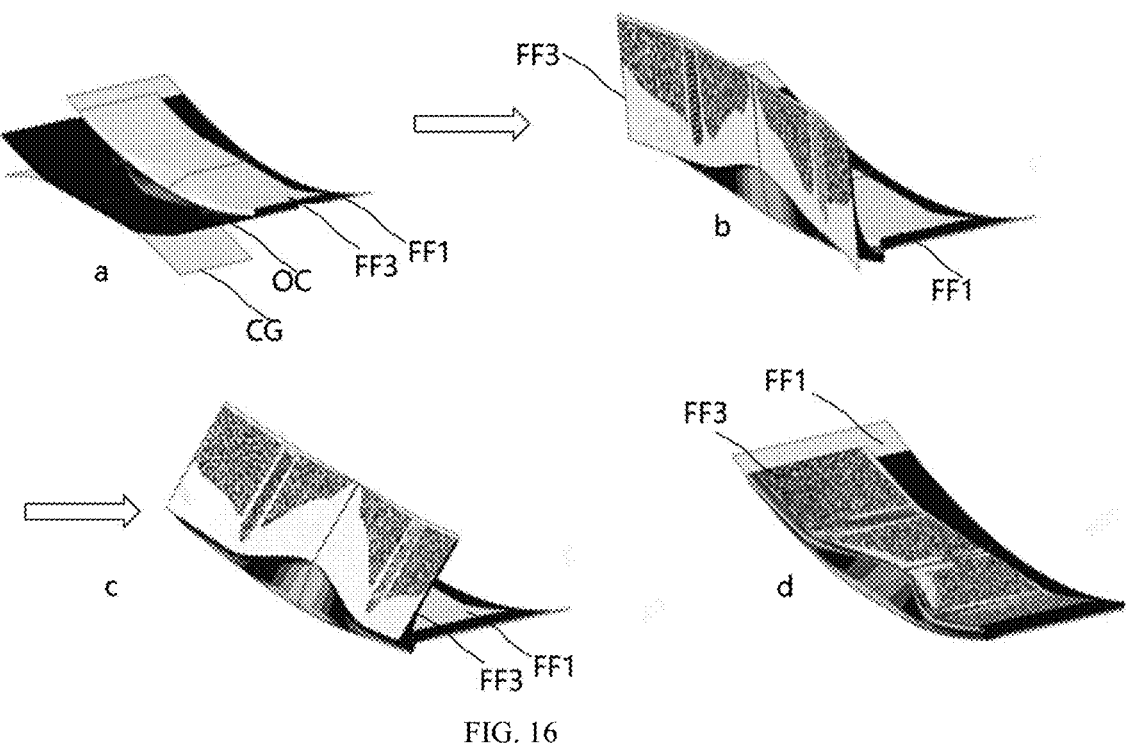
FIG. 16 is a schematic diagram of stress simulation distribution of a bending portion of a display panel according to a fourth embodiment of the present application, wherein the bending portion is bent.
Figure 17:
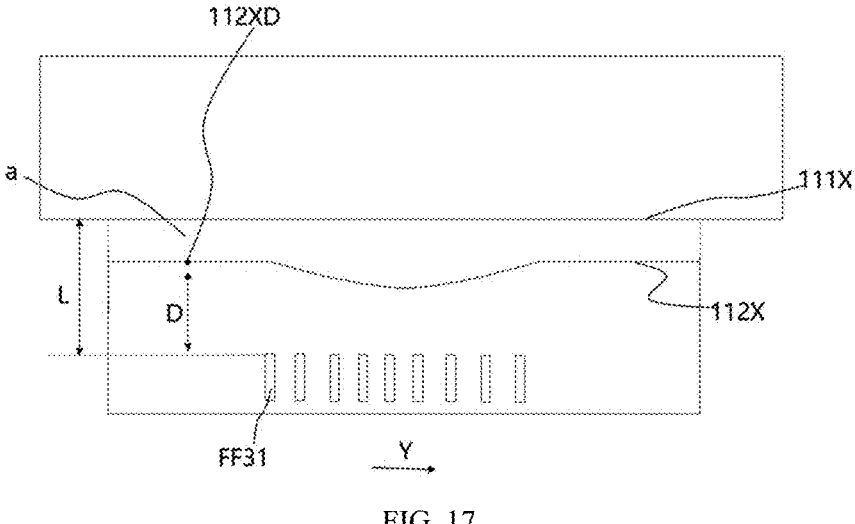
FIG. 17 is a schematic diagram showing a distance relationship between a first edge and a pad terminal of a display panel according to a fourth embodiment of the present application.

Reference is made to FIG. 1 to FIG. 3, and FIG. 10 to FIG. 17; wherein FIG. 10 is a schematic cross-sectional view of a bending portion of a display panel according to a fourth embodiment of the present application, wherein the bending portion is not bent; FIG. 11 is a schematic cross-sectional view of a display panel according to a fourth embodiment of the present application, wherein the display panel is bent; FIG. 12 is a schematic view of an edge of a bending portion of a display panel according to a fourth embodiment of the present application; FIG. 13 is a perspective view of an edge of a bending portion of a display panel according to a fourth embodiment of the present application, wherein the edge of the bending portion is bent; FIG. 14 is a schematic cross-sectional view taken along a dashed line D-D of FIG. 13 to show a film layer structure according to a fourth embodiment of the present application; FIG. 15 is a schematic cross-sectional view taken along a dashed line B-B of FIG. 13 to show a film layer structure according to a fourth embodiment of the present application; FIG. 16 is a schematic diagram of stress simulation distribution of a bending portion of a display panel according to a fourth embodiment of the present application, wherein the bending portion is bent; and FIG. 17 is a schematic diagram showing a distance relationship between a first edge and a pad terminal of a display panel according to a fourth embodiment of the present application. The dashed line D-D and the dashed line B-B are parallel to the first direction X, the dashed line D-D is along the end of the second edge, the dashed line B-B is along the central of the second edge, and FIGS. 12 to 13 merely show the back plate 11 and the display panel body 10.

It should be noted that FIG. 10 is a schematic cross-sectional view taken along the dashed line A-A in FIG. 1; and FIG. 11 is a schematic cross-sectional view taken along the dashed line B-B in FIG. 13. The first direction X and the second direction Y are shown in FIGS. 1, 10 and 13, the dashed line A-A is parallel to the first direction X, and the dashed line B-B is parallel to the first direction X in FIG. 13.

In some embodiments, the pad portion FF3 is connected to an arc-shaped side edge of the display portion FF1, and the display panel 100 further includes a back plate 11. The back plate 11 includes a first back plate 111 attached to the backlight side of the display portion FF1, and a second back plate 112 attached to a side of the pad portion FF3 close to the display portion FF1. The first back plate 111 includes a first edge 111X close to the bending portion, and the second back plate 112 includes a second edge 112X close to the bending portion FF2. The first edge 111X is linear, and the second edge 112X includes a first sub-segment edge 112X1. The first sub-segment edge 112X1 corresponds to an intermediate portion of the arc-shaped side edge of the first arc shape 101. The distance from the second edge 112X to the first edge 111X has a decreasing tendency from the center of the first sub-segment edge 112X1 to both ends of the first sub-segment edge 112X1.

Specifically, the display portion FF1 is bent at least around the first direction X into a first arc shape having a first radius of curvature, so that the display portion FF1 has an arc-shaped side edge 1001.

Specifically, as shown in FIGS. 10 and 11, the first back plate 111 is attached to the backlight side of the display unit FF1, and the backlight side of the display unit FF1 refers to the side without displaying images, or the backlight side of the display unit FF1 is opposite to the side for displaying images. The backlight side of the display unit FF1 also refers to the backside of the display unit FF1.

Specifically, as shown in FIG. 10, the back plate 11 includes a first back plate 111 attached to the backside of the display portion FF1 and a second back plate 112 attached to the backside of the pad portion FF3. As shown in FIG. 11, when the bending portion FF3 is bent, both the first back plate 111 and the second back plate 112 are positioned between the display portion FF1 and the pad portion FF3.

Specifically, no film layer of the back plate 11 is provided at the bending portion FF2, the first edge 111X and the second edge 112X are the edges closest to the bending portion FF2, and the first edge 111X and the second edge 112X are opposite to each other. In a case that the bending portion FF2 is bent, the bending portion FF2 is bent from the first edge 111X to the second edge 112X, the first edge 111X corresponds to a start line for bending, and the second edge 112X corresponds to an end line for bending.

In the present embodiment, the first edge 111X is provided as a straight shape, the portion of the second edge 112X corresponding to an intermediate portion of the arc-shaped side edge of the first arc shape 101 is the first sub-segment edge 112X1. The distance from the second edge 112X to the first edge 111X has a decreasing tendency from the center of the first sub-segment edge 112X1 to both ends of the first sub-segment edge 112X1. As such, in a case that the bending portion FF2 is bent and the pad portion FF3 is bent with the bending of the bending portion FF2, the bending portion FF2 is bent smoothly, and the display portion FF1 and the pad portion FF3 are smoothly transferred to the bending portion FF2, respectively. The interference problems such as wrinkles on the edge of the bending portion FF2 is prevented, thereby improving the reliability of the display panel 100.

In some embodiments, the end portion of the first back plate 111 close to the bending portion FF2 is a first end 111Y, and the end portion of the second back plate 112 close to the bending portion FF2 is a second end 112Y. The distance from at least a part of the first end 111Y to the edge of the display panel corresponding to the bending portion FF2X is less than the distance from the second end 112Y to the edge of the display panel corresponding to the bending portion FF2X.

Specifically, referring to FIG. 14, FIG. 14 is a cross-section taken along the dashed line D-D in FIG. 13, where the dashed line D-D is along the end position of the second edge 112X. Here, in the first direction X, the distance from the first end 111Y to the edge of the display panel corresponding to the bending portion FF2X may be equal to the distance from the second end 112Y to the edge of the display panel corresponding to the bending portion FF2X.

Specifically, referring to FIG. 15, FIG. 15 is a cross-sectional view taken along the dashed line B-B in FIG. 13. The dashed line B-B is along the center position of the second edge 112X. Here, in the first direction X, the distance from the first end 111Y to the edge of the display panel corresponding to the bending portion FF2X is less than the distance from the second end 112Y to the edge of the display panel corresponding to the bending portion FF2X.

Specifically, in comparison with FIG. 14 and FIG. 15, a distance from the first end 111Y to the edge of the corresponding bending portion FF2X of the display panel in the first direction is reduced along a direction from the end portion of the second edge 112X to the center position of the second edge 112X. In other words, a distance from the second end 112Y to the edge of the corresponding bending portion FF2X of the display panel in the first direction is increased along a direction from the end portion of the second edge 112X to the center position of the second edge 112X.

Specifically, as shown in FIG. 16, the a diagram in FIG. 16 shows a schematic diagram of stress simulation distribution of the display panel, wherein an optical cement OC is attached to the cover glass CG (window, CG), the view b shown in FIG. 16 is the schematic diagram of stress simulation distribution of view a rotated by 90 degrees, the view c shown in FIG. 16 is the schematic diagram of stress simulation distribution of view a rotated by 135 degrees, and the view d shown in FIG. 16 is the schematic diagram of stress simulation distribution of view a rotated by 180 degrees. FIG. 16 is the schematic diagram of the stress distribution where bending portion FF2 is bent. In FIG. 16, gray and white backgrounds indicate the stress distribution, and gray background indicates the presence of stress. However, the stress shown in FIG. 16 does not exceed the threshold value of crack generation, indicating that the bending method of the bending portion FF3 of the present application is feasible. Meanwhile, in FIG. 16, the darker the black/gray background indicates the greater the stress, and the simulation result in FIG. 16 shows that the stress on bending the bending portion FF2 is not the greatest (the black/gray background of the bending portion FF2 is lighter), and that the most serious deformation is generated at where the bending portion FF2 is pulled. The improved method of the present invention can reduce the stress of the bending portion FF2, improve the bending performance of the bending portion FF2, and reduce the stress concentration.

Reference is made to FIG. 17.

In some embodiments, the pad portion FF3 includes a plurality of pad terminals FF31, the plurality of pad terminals FF31 are arranged in a line parallel to the first edge 111X, and distances from any point on the first edge 111X to the line on which the plurality of pad terminals FF31 are located are the same. The second edge 112X includes a first point 112XD. A distance D is defined from the first point 112XD to the line on which the plurality of pad terminals FF31 are located. The bending portion between the first point and the first edge has a tensile ratio a. The distance D is inversely correlated with the tensile ratio a.

Specifically, the distance D is inversely correlated with the tensile ratio a, that is, the greater the tensile ratio a of the bending portion between the first point and the first edge, the less the distance D from the first point 112XD to the line on which the plurality of pad terminals FF31 are located. The less the tensile ratio a of the bending portion between the first point and the first edge, the greater the distance D from the first point 112XD to the line on which the plurality of pad terminals FF31 are located.

Specifically, the pad portion FF3 includes a plurality of pad terminals FF31 arranged in an extension direction parallel to the first edge 111X, the distances from any point on the first edge 111X to a straight line on which the plurality of pad terminals FF31 are located are equal. Before the bending portion FF2 is bent, the distance L is defined between the first edge 111X and the straight line on which the plurality of pad terminals FF31 are located, the second edge 112X includes the first point 112XD located at any point of the second edge 112X, and the distance D is defined between the first point 112XD and the straight line on which the plurality of pad terminals FF31 are located. After the bending portion FF2 is bent, the tensile ratio a is defined by the bending portion FF2 between the first edge 111X and the first point 112XD, and the following formula is satisfied: $L \geq D+(L-D)*a$.

In some embodiments, as shown in FIG. 1, portions of the display portion FF1 on both sides of the first arc shape 101 are bent respectively, in order to provide a second arc shape 102 and a third arc shape 103. The second arc shape 102 and the third arc shape 103 have a second radius of curvature, and the first radius of curvature is greater than the second radius of curvature.

Specifically, the second arc shape 102, the first arc shape 101, and the third arc shape 103 are sequentially arranged in the second direction Y, and the first radius of curvature is greater than the second radius of curvature, so that the display panel 100 has an aesthetic appearance.

In some embodiments, the second edge 112X includes a second sub-segment edge 112X2 on a side of the first sub-segment edge 112X1, and a third sub-segment edge

112X3 on the other side of the first sub-segment edge 112X1. The second sub-segment edge 112X2 corresponds to at least the second arc shape 102, and the third sub-segment 112X3 corresponds to at least the third arc shape 103.

Specifically, the second sub-segment edges 112X2 correspond to at least the second arc shape 102, the third sub-segment edge 112X3 corresponds to at least the third arc shape 103, and the first sub-segment edge 112X1 corresponds to at least the middle portion of the first arc-shaped surface 101. As such, each portion of the bending portion FF2 can be smoothly bent.

It should be noted that the smooth bending of the bending portion FF2 means that the bending portion FF2 is smoothly bent in the first direction X, and that the edge portion of the bending portion FF2 is not subject to an interference problem such as wrinkling in the second direction Y. As shown in FIG. 2, FIG. 2 also illustrates the bending section of the portion FF3Z, and the preferred bending portion FF2 is bent into a part of a circle in the first direction X, so that the reliability of the display panel is improved.

Embodiment 5

The present embodiment is the same as or similar to the display panel of any one of the above-described embodiments. The present embodiment further describes the structure of the display panel on the basis of the display panel of any one of the above-described embodiments.

Figure 18:
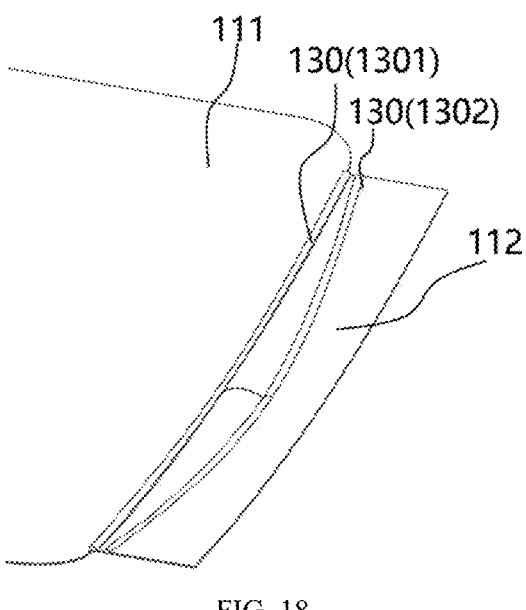
FIG. 18 is a schematic diagram of dispensing positions of a protective glue line of a display panel according to a fifth embodiment of the present application.

Referring to FIG. 18, FIG. 18 is a schematic diagram of dispensing positions of a protective glue line of a display panel according to a fifth embodiment of the present application.

In some embodiments, the display panel 100 further includes a protective glue line 130, the protective glue line 130 includes a first sub-protective glue line 1301 disposed corresponding to the first edge 111X and a second sub-protective glue line 1302 disposed corresponding to the second edge 112X. The extension direction of the first sub-protective glue line 1301 is same as the extension direction of the first edge 111X. The extension direction of the second sub-protective glue line 1302 is same as the extension direction of the second edge 112X.

Specifically, the protective glue line 130 functions to maintain the bent configuration of the first edge 111X and the second edge 112X of the bending portion FF2.

In some embodiments, the first sub-protective glue 1301 is disposed on the first edge 111X and the second sub-protective glue 1302 is disposed on the second edge 112X. Alternatively, the first sub-protective glue line 1301 is provided on the side of the display panel body 10 away from the first edge 111X, and the second sub-protective glue line 1302 is provided on the side of the display panel body 10 away from the second edge 112X.

Specifically, the orthographic projection of the first sub-protective glue line 1301 on the display panel body 10 covers the orthographic projection of the first edge 111X on the display panel body 10, and the orthographic projection of the second sub-protective glue line 1302 on the display panel body 10 covers the orthographic projection of the second edge 112X on the display panel body 10.

Specifically, FIG. 18 illustrates the first sub-protective glue 1301 disposed on the first edge 111X and the second sub-protective glue 1302 disposed on the second edge 112X. However, it should be understood that the first sub-protective glue 1301 may be provided on the side of the display panel body 10 away from the first edge 111X, and the second sub-protective glue 1302 may be provided on the side of the display panel body 10 away from the second edge 112X.

It should be noted that in any of the above-described embodiments, as shown in FIG. 4, FIG. 6, FIG. 8, and FIG. 11, a composite support layer may be provided between the first back plate 111 and the second back plate 112, and the composite support layer may include at least one of a foam 50, a double-sided adhesive tape 72, a rigid support layer, a heat sink layer, and the like. The display panel may further include an optical adhesive layer 13 disposed on a side of the display portion FF1 away from the pad portion, and a cover plate layer 14.

The display panel according to embodiments of the present application is described in detail, and embodiments are used to illustrate the principles and implements of the present application. The description of the above embodiments is merely provided to assist in understanding the implement way of the present application and the core concepts thereof. At the same time, variations will occur to those skilled in the art in both the detailed description and the scope of application in accordance with the teachings of the present application. In view of the foregoing, the present description should not be construed as limiting the application.

The invention claimed is:

1. A display panel, comprising:
a display panel body including a display portion, a bending portion, and a pad portion, wherein the pad portion is provided on a backlight side of the display portion, the bending portion is extensible, the display portion is bent about at least a first direction to define a first arc shape, and the first arc shape has a first radius of curvature;
a driving chip bonded to the pad portion;
a support pad provided between the display portion and the pad portion, wherein the support pad is provided corresponding to at least the driving chip, the support pad includes a first surface toward the display portion and a second surface toward the pad portion, the first surface is in contact with the first arc shape, and the second surface is a flat surface.

2. The display panel of claim 1, wherein the pad portion is connected to an arc-shaped side edge of the display portion, and the display panel further comprises:
a back plate including a first back plate and a second back plate, wherein the first back plate is attached to the backlight side of the display portion, and the second back plate is attached to a side of the pad portion close to the display portion;
wherein the first back plate includes a first edge close to the bending portion, and the second back plate includes a second edge close to the bending portion;
wherein the first edge is linear, the second edge includes a first sub-segment edge corresponding to an intermediate portion of the arc-shaped side edge of the first arc shape, and a distance from the second edge to the first edge has a decreasing tendency from a center of the first sub-segment edge to both ends of the first sub-segment edge.

3. The display panel of claim 2, wherein the display position is bent on both sides of the first arc shape to provide a second arc shape and a third arc shape respectively, the second arc shape and the third arc shape have a second radius of curvature, and the first radius of curvature is greater than the second radius of curvature.

4. The display panel of claim 3, wherein:

the second edge includes a second sub-segment edge on a side of the first sub-segment edge, and a third sub-segment edge on another side of the first sub-segment edge; and the second sub-segment edge corresponds to at least the second arc shape, and the third sub-segment edge corresponds to at least the third arc shape.

5. The display panel of claim 2, further comprising:

a protective glue line including a first sub-protective glue line and a second sub-protective glue line, wherein the first sub-protective glue line is arranged corresponding to the first edge, the second sub-protective glue line is arranged corresponding to the second edge, the first sub-protective glue line is extended in a same direction with the first edge, and the second sub-protective glue line is extended in a same direction with the second edge.

6. The display panel of claim 5, wherein:

the first sub-protective glue line is provided on the first edge, and the second sub-protective glue line is provided on the second edge; or the first sub-protective glue is disposed on a side of the display panel body away from the first edge, and the second sub-protective glue line is disposed on a side of the display panel body away from the second edge.

7. The display panel of claim 2, wherein a first end is defined on an end of the first back plate close to the bending portion, a second end is defined on an end of the second back plate close to the bending portion, and a distance from at least a part of the first end to an edge of the display panel corresponding to the bending portion is less than a distance from the second end to an edge of the display panel corresponding to the bending portion.

8. The display panel of claim 2, wherein:

the pad portion includes a plurality of pad terminals, the plurality of pad terminals is arranged in a line parallel to the first edge, and each of points on the first edge has a same distance to the line; and the second edge includes a first point on the second edge, a distance D is defined from the line to the first point, the bending portion between the first point and the first edge has a tensile ratio a, and the distance D is inversely correlated with the tensile ratio a.

9. The display panel of claim 1, wherein:

a width of the pad portion in a second direction is less than a width of the display portion in the second direction;

a width of the support pad in the second direction is greater than or equal to the width of the pad portion in the second direction, and the first direction is perpendicular to the second direction; and a curvature of the first surface is same as a curvature of the first arc shape.

10. The display panel of claim 9, wherein:

the support pad includes a first sub-support pad and a second sub-support pad, the first sub-support pad and the second sub-support pad are stacked, a width of the first sub-support pad in the second direction is greater than a width of the second sub-support pad in the second direction, and an elastic modulus of the first sub-support pad is less than an elastic modulus of the second sub-support pad; wherein the first sub-support pad includes a groove close to a side surface of the pad portion, the second sub-support pad is received in the groove, and an orthographic projection of the second sub-support pad on the pad portion covers an orthographic projection of the driving chip on the pad portion; and a surface of the first sub-support pad close to the pad portion and a surface of the second sub-support pad close to the pad portion are on a same plane.

11. The display panel of claim 10, wherein material of the first sub-support pad comprises acrylic resin, and material of the second sub-support pad comprises stainless steel.

12. The display panel of claim 9, wherein:

the support pad comprises a third sub-support pad and a fourth sub-support pad, the third sub-support pad comprises a first sub-segment and a second sub-segment spaced apart, the fourth sub-support pad is arranged between the first sub-segment and the second sub-segment in the second direction, an elastic modulus of the third sub-support pad is less than an elastic modulus of the fourth sub-support pad, and an orthographic projection of the fourth sub-support pad on the pad portion covers an orthographic projection of the driving chip on the pad portion; and a portion of the first surface corresponding to the first sub-segment has a same curvature with a portion of the first arc shape attached with the first sub-segment, and a portion of the first surface corresponding to the second sub-segment has a same curvature with a portion of the first arc shape attached with the second sub-segment.

13. The display panel of claim 12, wherein the first sub-segment is disposed between the display portion and the pad portion, and the second sub-segment is disposed between the display portion and the pad portion; wherein a side of the fourth sub-support pad is attached to the pad portion, and another side surface of the fourth sub-support pad is spaced from the display portion.

14. The display panel of claim 9, wherein the driving chip is arranged on a side of the pad portion away from the display portion.

15. The display panel of claim 10, wherein the driving chip is arranged on a side of the pad portion away from the display portion.

16. The display panel of claim 11, wherein the driving chip is arranged on a side of the pad portion away from the display portion.

17. The display panel of claim 12, wherein the driving chip is arranged on a side of the pad portion away from the display portion.

18. The display panel of claim 13, wherein the driving chip is arranged on a side of the pad portion away from the display portion.

* * * * *